(12) United States Patent
Sakakura

(10) Patent No.: US 7,554,326 B2
(45) Date of Patent: Jun. 30, 2009

(54) MRI GRADIENT MAGNETIC COIL UNIT ASSEMBLEY USING DIFFERENT RESINS WITHIN WINDINGS AND BETWEEN COMPONENTS

(75) Inventor: Yoshitomo Sakakura, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 11/798,383

(22) Filed: May 14, 2007

(65) Prior Publication Data

US 2007/0268021 A1 Nov. 22, 2007

(30) Foreign Application Priority Data

May 17, 2006 (JP) .............................. 2006-138040

(51) Int. Cl.
*G01V 3/00* (2006.01)
(52) U.S. Cl. .......................... 324/318; 324/307; 324/321
(58) Field of Classification Search ......... 324/300–322; 600/407–435
See application file for complete search history.

(56) References Cited

U.S. PATENT DOCUMENTS

| 5,570,021 | A * | 10/1996 | Dachniwskyj et al. ...... 324/318 |
| 7,030,610 | B2 * | 4/2006 | Mansfield .................... 324/318 |
| 7,068,033 | B2 * | 6/2006 | Sellers et al. ................ 324/318 |
| 2004/0119472 | A1 * | 6/2004 | Laskaris et al. ............. 324/318 |
| 2005/0030028 | A1 * | 2/2005 | Clarke et al. ................ 324/318 |
| 2005/0035764 | A1 * | 2/2005 | Mantone et al. ............. 324/318 |
| 2005/0146330 | A1 * | 7/2005 | Teklemariam et al. ...... 324/318 |
| 2005/0168222 | A1 | 8/2005 | Arz et al. |
| 2006/0066309 | A1 * | 3/2006 | Arik et al. ................... 324/318 |
| 2006/0220646 | A1 * | 10/2006 | Kurome et al. .............. 324/318 |
| 2006/0279285 | A1 * | 12/2006 | Morita et al. ................ 324/318 |
| 2007/0066883 | A1 * | 3/2007 | Kimmlingen et al. ....... 600/410 |
| 2007/0080689 | A1 * | 4/2007 | Konijn et al. ................ 324/318 |
| 2007/0268021 | A1 * | 11/2007 | Sakakura .................... 324/318 |

FOREIGN PATENT DOCUMENTS

JP          6-269422          9/1994

* cited by examiner

*Primary Examiner*—Brij B. Shrivastav
*Assistant Examiner*—Tiffany A Fetzner
(74) *Attorney, Agent, or Firm*—Nixon & Vanderhye PC

(57) ABSTRACT

A magnetic resonance imaging apparatus includes gradient magnetic coil, each having a plurality of line members wound in a predetermined winding pattern. A first resin material fills gaps between the plurality of coils, and a second resin material, which has higher thermal conductivity than that of the first resin material, fills gaps formed between the line members of a given coil

13 Claims, 5 Drawing Sheets

MRI GRADIENT MAGNETIC COIL UNIT ASSEMBLEY USING DIFFERENT RESINS WITHIN WINDINGS AND BETWEEN COMPONENTS

CROSS-REFERENCE TO RELATED APPLICATIONS

This application is based upon and claims the benefit of priority from the prior Japanese Patent Application No. 2006-138040, filed May 17, 2006, the entire contents of which are incorporated herein by reference.

BACKGROUND OF THE INVENTION

1. Field of the Invention

The present invention relates to a gradient magnetic coil having resin material infiltrated thereto, a method of manufacturing the gradient magnetic coil, and a magnetic resonance imaging (MRI) apparatus having the gradient magnetic coil.

2. Description of the Related Art

A medical MRI apparatus generally includes a gantry. The gantry generally includes magnetostatic magnets, gradient magnetic coils, cooling pipes, and the like.

The gradient magnetic coils include a plurality of coils and generate gradient magnetic field when electric current flows through the plurality of coils. The coils are formed of conductive line members wound in a winding pattern corresponding to a gradient magnetic field pattern to be generated. Resin materials are filled into gaps between identical line members or gaps between line members of different coils. The resin materials serve to provide insulation between the line members and maintain the winding state of the line members which are would in the above-mentioned winding pattern.

However, recent MRI apparatuses require greater gradient magnetic field and fast initial start-up. For this reason, it is necessary to supply a large amount of current to the gradient magnetic coils. Accompanied by the large current supply, the coils are more likely to emit an increased amount of heat. Thus, cooling of the gradient magnetic coil is becoming important (see, U.S. Pat. No. 6,741,152, for example).

As the resin material, an epoxy resin has been used so far. Since the epoxy resin has low viscosity at high temperature, it can be suitably used in spreading it into all the corners of the coil gaps, but it has extremely low heat conductivity. Accordingly, in a gradient magnetic coil in which the epoxy resin is filled into the gaps of the coils, the epoxy resin acts as a barrier preventing the heat generated in the coil from being dissipated toward the cooling pipes, thereby lowering the cooling performance.

In view of those circumstances, it is required to improve heat dissipation efficiency of the gradient magnetic coil.

BRIEF SUMMARY OF THE INVENTION

According to a first aspect of the invention, there is provided a magnetic resonance imaging apparatus, including a gantry which has a gradient magnetic coil unit generating a gradient magnetic field to be applied to a subject in a magnetostatic field, a bed which allows a top board, on which the subject is placed, to slide in a longitudinal direction, a pulse applying unit which applies a high-frequency pulse to the subject, and a high-frequency coil which detects a magnetic resonance signal generated from the subject by applying the gradient magnetic field and the high-frequency pulse, wherein the gradient magnetic coil unit includes a plurality of coils having line members wound in a predetermined winding pattern, a first resin material filled in gaps between the plurality of coils, and a second resin material which has higher thermal conductivity and a second resin material which has higher thermal conductivity than that of the first resin material and is filled in gaps formed between the line members of at least one coil line winding.

According to a second aspect of the invention, there is provided a method of manufacturing a gradient magnetic coil unit having a plurality of coils in a predetermined winding pattern, the method including: filling a resin material of a clay type into gaps between the line members formed by winding the line member of at least one coil of the plurality of coils; arranging the plurality of coils; allowing a liquid resin material to flow into gaps between the plurality of coils; and curing the liquid resin material.

According to a third aspect of the invention, there is provided a gradient magnetic coil unit including a plurality of coils wound in a predetermined winding pattern, a first resin material which is filled into gaps between the plurality of coils, and a second resin material which has higher thermal conductivity than that of the first resin material and is filled into the gaps formed between the line members of at least one coil winding.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, an embodiment of the invention will be described with reference to the accompanying drawings.

Figure 1:
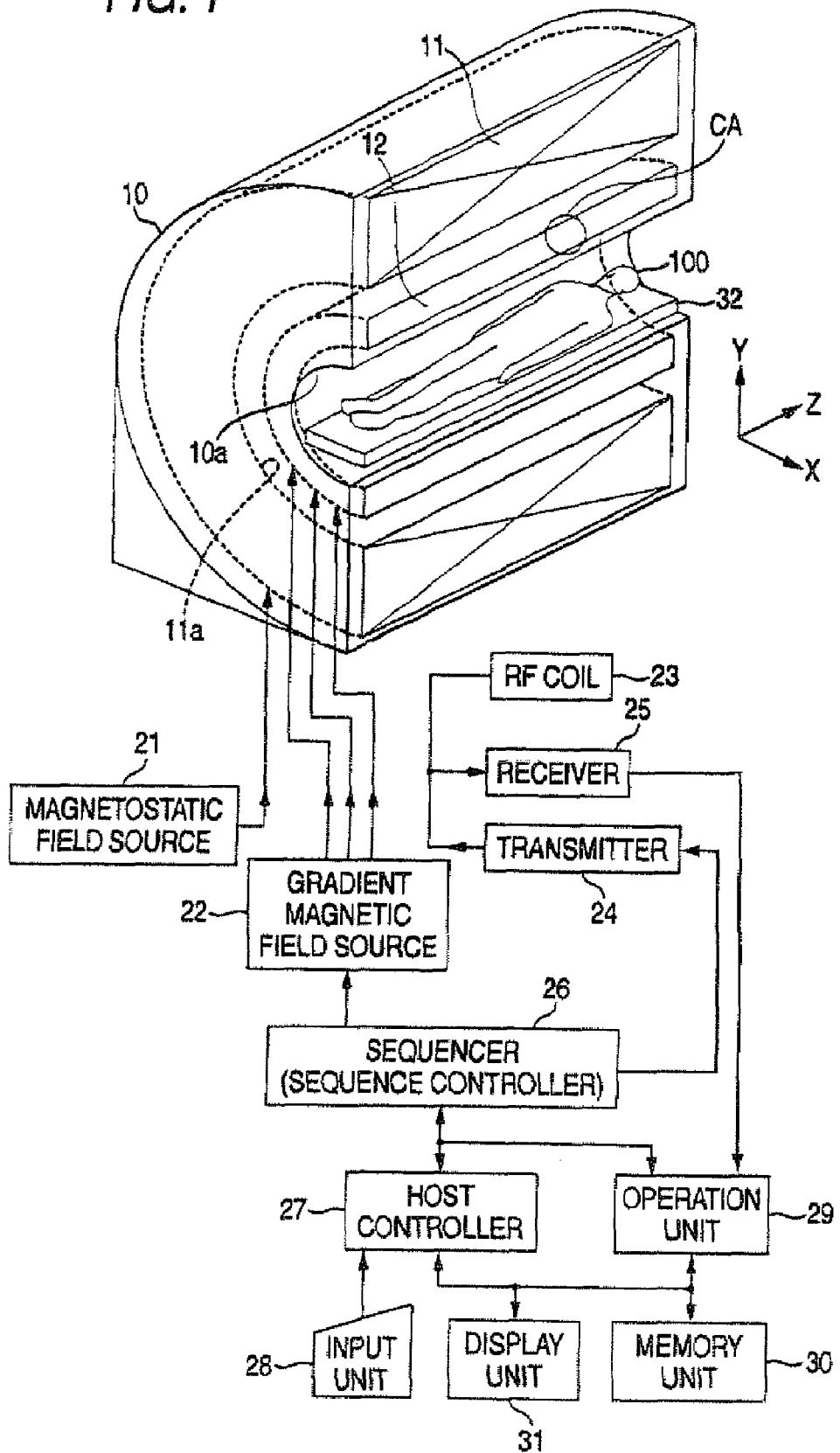
FIG. 1 is a partial schematic view illustrating a MRI apparatus according to an embodiment of the invention.

FIG. 1 is a partial schematic view illustrating a MRI apparatus according to an embodiment of the invention.

The MRI apparatus according to the present embodiment includes a gantry 10, a magnetostatic magnet 11, a gradient magnetic coil 12, a magnetostatic field source supply 21, a gradient magnetic power supply 22, a high frequency coil (RF coil) 23, a transmitter 24, a receiver 25, a sequencer 26, a host controller 27, an input unit 28, an operation unit 29, a memory unit 30, and a display unit 31. In addition, the MRI apparatus includes a bed (not shown) which is disposed adjacent to the gantry 10. The sequence 26, the host controller 27, the operation unit 29, and the memory unit 30 are included in a control processing unit (computer system).

The gantry 10 is generally formed with a substantially cylindrical imaging space 10a that is formed in the central portion of the inner space of the gantry 10. Assuming that the axial direction of the imaging space is the Z direction, the remaining two directions which are perpendicular to the Z direction and with each other are defined as the X direction (left and right direction) and the Y direction (up and down direction). The gantry 10 shown in FIG. 1 corresponds to only one-half of the whole gantry 10 broken by the YZ plane.

The magnetostatic magnet 11 and the gradient magnetic coil 12 are accommodated in the gantry 10. The magnetostatic magnet 11 is supplied with a current from the magnetostatic field source supply 21 and generates magnetostatic field HO in the imaging space. A superconductor magnet is generally used as the magnetostatic magnet 11. The whole shape of the magnetostatic magnet 11 is in a substantially cylindrical shape. In the inner space of the magnetostatic magnet 11, a magnet bore 11a is formed (hereinafter, referred to as bore). The central axis of the bore 11a corresponds to the central axis of the imaging space 10a. The gradient magnetic coit 12 is disposed in the bore 11a. The gradient magnetic coil 12 includes three sets of coils which receive driving currents corresponding to the X, Y, and Z axis respectively from the gradient magnetic power supply 22 and generate the gradient magnetic fields respectively corresponding to the X, Y, and Z axis.

At the time of imaging, the RF coil 23 is placed in the inside of the imaging space 10a. The RE coil 23 is connected to the transmitter 24 and the receiver 25. The transmitter 24 supplies a pulse current at Lamor frequency to the RF coil 23 under the control of the sequencer 26. The receiver 25 receives a magnetic resonance (MR) signal through the RE coil 23 and performs various signal processing treatments, thereby generating the corresponding digital signals. A top board 32 of the bed can be moved toward and away from the imaging space 10a in the gantry 10, an inspection object 100 is placed on the top board 32.

The sequencer 26 operates under the control of the host controller 27 that controls the whole MRI apparatus. The input unit 28 is connected to the host controller 27. The operator can select a desirable pulse sequence from a plurality of pulse sequences using a method such as a spin echo (SE) method or an echo planar (EPI) method by operating the input unit 28. The host controller 27 sets a selected pulse sequence to the sequencer 26. The sequencer 26 controls the application timing and strength of the gradient magnetic field in each of the X, Y and Z axis directions and the application timing, amplitude and duration of high-frequency magnetic field, in accordance with the set pulse sequence.

The operation unit 29 receives an MR signal (digital data) generated by the receiver 25 and performs a Fourier transform for arranging actual measurement data in a two-dimensional Fourier space to reorganize images using an internal memory, thereby generating image data or spectrum data. The memory unit 30 stores the operated image data. The display unit 31 displays the image.

Figure 2:
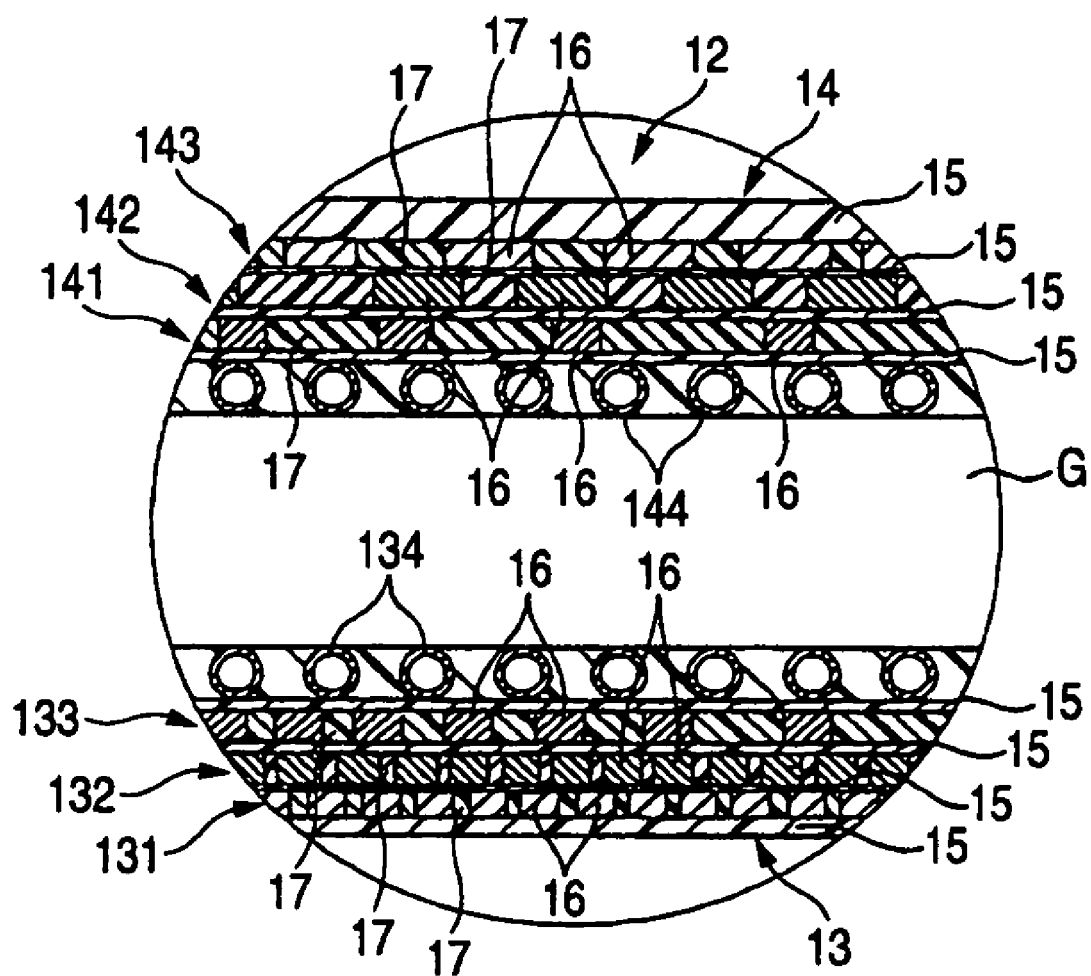
FIG. 2 is a partial sectional view illustrating a gradient magnetic coil shown in FIG. 1.

FIG. 2 is a partial sectional view of the gradient magnetic coil 12 and shows an enlarged view of a portion surrounded by the circle CA in FIG. 1.

As shown in FIG. 2, the gradient magnetic coil 12 includes a main coil unit 13 and a shield coil unit 14, and the entire surfaces of the gradient magnetic coil are covered with an epoxy resin 15. The epoxy resin 15 can be replaced by a room-temperature curable resin of a different kind, which has a low viscosity in a liquid state.

The main coil unit 13 includes an X-main coil 131, a Y-main coil 132, a Z-main coil 133, and a cooling pipe 134. The X-main coil 131, Y-main coil 132, and Z-main coil 133 are formed of the conductive line members 16 which are respectively wound in patterns suitable for generating gradient magnetic fields corresponding to the X, Y, and Z axis. Compound material 17 is filled into the interstitial gaps between the identical conductive line members 16. The X-main coil 131, the Y-main coil 132 and the Z-main coil 133 are laminated onto each other in this order in a direction away from the inside of the gradient magnetic coil 12 with a gap therebetween. Outside the Z-main coil 133, the cooling pipes 134 are disposed in a spiral shape. The gaps between the cooling pipe 134 are filled with the compound material 17. In addition, the epoxy resin 15 is filled into a surface of the X-main coil 131 disposed in the inner side of the gradient magnetic coil 12, a gap between the X-main coil 131 and the Y-main coil 132, a gap between the Y-main coil 132 and the Z-main coil 133, and a gap between the Z-main coil 133 and the cooling pipe 134.

The shield coil unit 14 includes a Z-shield coil 141, an X-shield coil 142, a Y-shield coil 143, and a cooling pipe 144. The Z-shield coil 141, the X-shield coil 142, and Y-shield 143 are formed of the conductive line members 16 which are respectively wound in patterns suitable for shielding gradient magnetic fields corresponding to the X, Y, and Z axis. The compound material 17 is filled into the gaps between the same line members 16. The Z-shield coil 141, the X-shield coil 142 and the Y-shield coil 143 are laminated onto each other in this order in a direction away from the inside of the gradient magnetic coil 12 with a gap therebetween. Inside the Z-shield coil 141, the cooling pipes 144 are disposed in a spiral shape. The gaps between the cooling pipes 144 are filled with the compound material 17. The cooling pipes 134 and 144 are connected to a circulation device (not shown), and cooling liquid circulates through the pipes 134 and 144.

As the compound material 17, a mixture of a filler such as silica to the epoxy resin may be used. Aluminum can be used as the filler for the silica. However, it is preferable that the filler have higher thermal conductivity than the epoxy resin and insulating and non-magnetic properties.

A gap G between the main coil unit 13 and the shield coil unit 14 is formed. In the gap G, an adjustment tray (not shown) which has a plurality of pockets for a steel shim to be inserted when it is necessary. The adjustment tray is inserted to the gap G and an intensity distribution of the magnetostatic field in an inside of the imaging spacing 10a is adjusted by the effect of the steel shim inserted in the pockets according to need.

Figure 3:
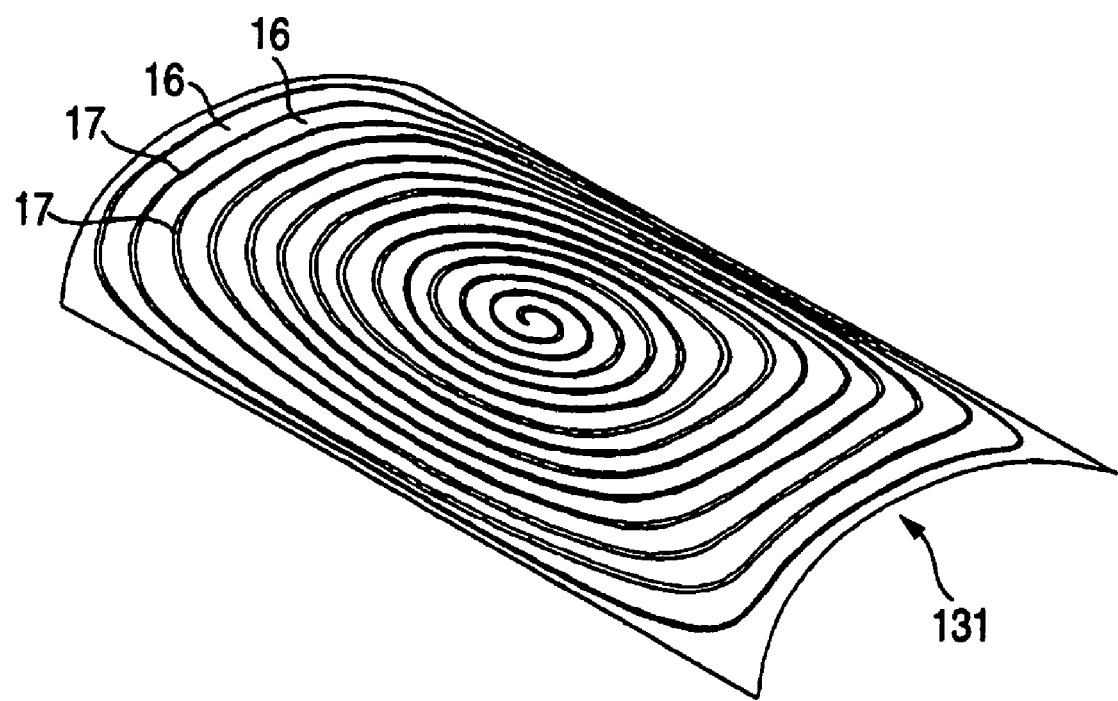
FIG. 3 is a perspective view illustrating an X-main coil included in the gradient magnetic coil shown in FIG. 1.

FIG. 3 is a perspective view illustrating the X-main coil 131. In FIG. 3, the X-main coil 131 is shown as the gantry 10 viewed from the diagonal below in FIG. 1.

As shown in FIG. 3, the line member 16 having a spiral shape is wound, which forms the X-main coil 131. In addition, the compound material 17 is filled into the gaps between the line members 16.

Although other coils 132, 133, 141, 142, and 143 have different winding patterns of the line member 16 from the X-main coil 131, the coils 132, 133, 141, 142, and 143 have the same configuration as the X-main coil 131.

Next, the gradient magnetic coil 12 as mentioned-above will be described hereinafter.

Firstly, the line member 16 is wound in accordance with the pattern of the coils 131, 132, 133,141,142 and 143 and the compound material 17 is applied to the gaps between the line members 16. Since the compound material 17 is a mixed filler, the compound material 17 has a higher viscosity than the epoxy resin. Accordingly, the compound material 17 has clay shape. Since the compound material 17 is directly applied to the gaps between the line members 16, the operation is easily performed.

Next, the compound material 17 is applied to the coils 131, 132, 133, 141, 142, 143, the cooling pipes 134, and 144 and the coils are inserted into a mold. Then, the epoxy resin 15 which is in a liquid state is filled into an inside of the mold. As shown in FIG. 2, the mold supports the coils 131, 132, 133, 141, 142, 143, the cooling pipes 134, and 144. The inserted coils 131, 132, 133, 141, 142, 143, the cooling pipes 134, and 144 may be fixed by using a glass tape, and the like, before the epoxy resin 15 is inserted into the mold. Since the epoxy resin has a low viscosity in a liquid state, the epoxy resin is easily infiltrated into the gaps between the coils or the gaps between the each coil and the cooling pipes 134, 144. Since the compound material 17 is cured at room temperature, in a process of inserting the epoxy resin 15, the compound material 17 may not be flowed from the coils 131, 132, 133, 141, 142, and 143.

In addition, after the epoxy resin 15 and the compound material 17 is solidified, the coils 131, 132, 133, 141, 142, 143, the cooling pipes 134, and 144 are taken out with the epoxy resin 15. Accordingly, the gradient magnetic coil 12 is made.

According to the above-mentioned embodiments, in the gradient magnetic coil 12, the compound material 17 is filled into a part of area in which the epoxy resin 15 has been filled conventionally. Since the compound material 17 has filler of which thermal conductivity is higher than that of the epoxy resin, the compound material 17 has a higher thermal conductivity than the epoxy resin 15. In addition, the epoxy resin 15 has a thin layer in gaps between the different coils and gaps between the coils and the cooling pipes 134 and 144. Accordingly, the heat generated from each line member 16 of the coils 131, 132, 133, 141, 142, and 143 is more efficiently transferred to the cooling pipes 134, 144 than the known method and is efficiently cooled by the cooling liquid.

When the heat-discharging efficiency is increased, it is possible to fill the compound material 17 into all the gaps without using the epoxy resin 15. Since the compound material 17 has a high viscosity, it is difficult to infiltrate the compound material 17 into gaps between the different coils and gaps between the coils and the cooling pipes 134, 144. Accordingly, it is difficult to manufacture the product. According to the embodiment, manufacturing process may be simplified by using separately the epoxy resin 15 and the compound material 17 and the heat-discharging efficiency may be increased as mentioned above.

Simulation Result

Figure 4:
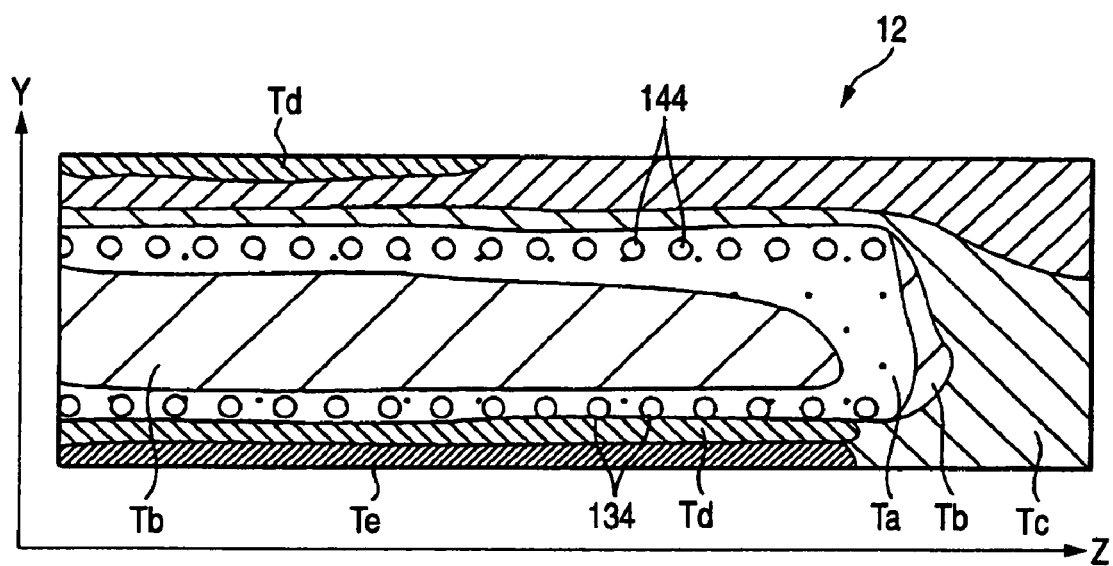
FIG. 4 is a diagram illustrating a temperature simulation result of the gradient magnetic coil shown in FIG. 1.
Figure 5:
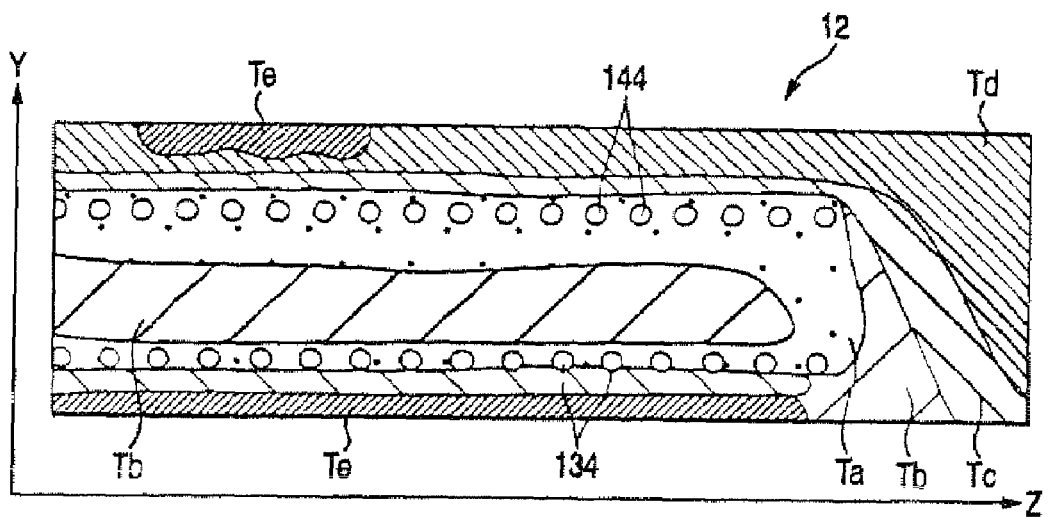
FIG. 5 is a diagram illustrating a temperature simulation result of the existing gradient magnetic coil.

FIG. 4 is a diagram illustrating a simulation result in accordance with a temperature rise by using the gradient magnetic coil 12 on YZ surface. FIG. 5 is a diagram illustrating a simulation result in accordance with a temperature rise of the known gradient magnetic coil on YZ surface. FIG. 4 and FIG. 5 are a simulation result, where the gradient magnetic coil 12 and the known gradient magnetic coil is operated with the same conditions (e.g., supply current of 15 kW) for the same time. In addition, the known gradient magnetic coil is a gradient magnetic coil in which the epoxy resin 15 is filled into an area having the compound material 17 in the gradient magnetic coil 12.

In FIGS. 4 and 5, hatching illustrates a difference of temperature. In FIGS. 4 and 5, the same hatching illustrates the same temperature area. The temperature is lowest in an area indicated by a symbol "Ta" and highest in an area indicated by a symbol "Te". That is, the temperatures in each area are different from each other with a relationship, "Ta <Tb <Tc <Td <Te". In FIGS. 4 and 5, configurations of the coils 131, 132, 133, 141,142, and 143 are not shown.

Comparing FIGS. 4 and 5, in the gradient magnetic coil 12, it is known that the high temperature area denoted by the symbol "Te" is sufficiently smaller than that of the known gradient magnetic coil, and it is difficult to increase the temperature of the gradient magnetic coil 12 more than that of the known gradient magnetic coil.

According to the simulation result, it is obvious that the gradient magnetic coil 12 of the embodiment more efficiently emits heat than the known gradient magnetic coil.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a gantry which has a gradient magnetic coil unit configured for generating a gradiant magnetic field applied to a subject in a magnetostatic field;
   a bed which allows a top board, on which the subject is placed, to slide in a longitudinal direction;
   a pulse applying unit which applies a high-frequency pulse to the subject; and
   a high-frequency coil in which detects a magnetic resonance signal generated from the subject by applying the gradient magnetic fields and the high-frequency pulse,
   wherein the gradient magnetic coil unit includes a plurality of conducting line members wound in a predetermined winding pattern for each of an x-coil, y-coil, and z-coil, a first resin material filling gaps between the conductor is a of a given coil for each of the plurality of coils, and a different second resin material, which has a higher thermal conduct to the than that of the first resin material, the second resin material filling the interstitial gaps formed between the conducting line members of at least one of the given x, y, z-coils.

2. The magnetic resonance imaging apparatus according to claim 1, wherein:
   the second resin material is obtained by mixing (a) a filler having higher thermal conductivity than that of a room-temperature curable resin into (b) the same room-temperature curable resin as the first resin material.

3. The magnetic resonance imaging apparatus according to claim 2, wherein the filler for the second resin material has insulating and non-magnetic properties.

4. The magnetic resonance imaging apparatus according to claim 1, wherein:
   the first resin material and the second resin material include a room-temperature curable resin, and
   the second resin material is higher in viscosity before being cured than the first resin material.

5. The magnetic resonance imaging apparatus according to claim 1, wherein:
   the gradient magnetic coil unit further includes a coiling pipe through which a cooling liquid absorbing heat generated from the conducting line members flows, and
   the first resin material fills a gap between at least one coil and the cooling pipe.

6. A method of assembling a gradient magnetic coil unit having a plurality of coils therein formed by winding conducting line members in a predetermined winding pattern, the method comprising:
   filling a viscous clay-type resin material into the interstitial gaps between conductive line members of the gradient coil unit formed by a winding of at least one coil up the plurality of coils;
   arranging the plurality of coils into a predetermined order which forms a gradient magnetic coil unit;
   allowing a different less viscous liquid resin material to flow into gaps between individual coils of the plurality of coils; and
   curing the different less viscous liquid resin material so that solidifies into the gradient magnetic coil unit.

7. The method according to claim 6, wherein the viscous clay-type resin material is obtained by (a) a filler having higher thermal conductivity than that of a room temperature curable resin into (b) the same room temperature curable resin as the different less viscous resin material.

8. The method according to claim 6, wherein a cooling pipe through which a cooling liquid absorbing heat generated from the conducting line members of the gradient magnetic coil unit is arranged along with the plurality of coils, and
   wherein the different less viscous liquid resin material fills a gap between at least one gradient coil of the plurality of coils and the cooling pipe in addition to gaps between individual ones of the plurality of gradient coils.

9. A gradient magnetic coil unit comprising:
   a plurality of conducting line members wound in a predetermined winding pattern for each of coral gradient coils;
   a first resin material filling gaps between individual ones of the plurality of gradient coils; and
   a second resin material, which has higher thermal conductivity than that of the first resin material, said second resin material filling interstitial gaps formed between individual conducting line members of each set gradient coil.

10. The gradient magnetic coil unit according to claim 9, wherein:
   the second resin material is obtained by mixing (a) a filler having higher thermal conductivity than that of a room-temperature curable resin into (b) the same room-temperature curable resin as the first resin material.

11. The magnetic resonance imaging apparatus according to claim 2, wherein the filler for the second resin material has insulating and non-magnetic properties.

12. The gradient magnetic coil unit according to claim 9, wherein:
   the first resin material and the second resin material include a room-temperature curable resin, and
   the second resin material is higher in viscosity before being cured than the first resin material.

13. A gradient magnetic coil unit according to claim 9, wherein:
   the gradient magnetic coil unit further includes a cooling pipe through which a cooling liquid absorbing heat generated from the conducting line members flows, and
   the first resin material also fills a gap between at least one coil of the gradient magnetic coil unit and the gradient cooling pipe.

* * * * *